(12) United States Patent
McBride

(10) Patent No.: US 6,701,290 B1
(45) Date of Patent: *Mar. 2, 2004

(54) METHOD AND APPARATUS FOR EVALUATING THE DESIGN QUALITY OF NETWORK NODES

(75) Inventor: John G McBride, Ft Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/252,950

(22) Filed: Feb. 18, 1999

(51) Int. Cl.$^7$ ............................................... G06F 17/50
(52) U.S. Cl. ............................. 703/15; 703/14; 703/13; 716/4
(58) Field of Search ............................... 703/1, 13, 14, 703/15; 716/4, 5, 12, 64; 711/104, 105

(56) References Cited

U.S. PATENT DOCUMENTS

| | | | | |
|---|---|---|---|---|
| 4,566,064 A | * | 1/1986 | Whitaker | 326/38 |
| 5,740,347 A | * | 4/1998 | Avidan | 714/33 |
| 5,966,521 A | * | 10/1999 | Takeuchi et al. | 716/6 |
| 5,987,237 A | * | 11/1999 | McBride | 703/1 |
| 6,173,435 B1 | * | 1/2001 | Dupenloup | 716/18 |
| 6,367,055 B1 | * | 4/2002 | McBride | 716/4 |

* cited by examiner

Primary Examiner—Kevin J. Teska
Assistant Examiner—Dwin M. Craig

(57) ABSTRACT

A method and apparatus for evaluating an integrated circuit design to determine whether a pass FET is part of a RAM cell structure in the integrated circuit design. The apparatus comprises a computer capable of being configured to execute a rules checker program which analyzes information relating to the integrated circuit to determine whether a pass FET in the integrated circuit is part of a RAM cell structure of the integrated circuit. The rules checker program of the present invention evaluates each pass FET which is channel-connected at one of its terminals to a latch node and determines whether that pass FET is channel-connected at one of its other terminals to the drain or source terminal of at least one other pass FET. If so, the pass FET being evaluated is part of a RAM cell structure. In accordance with the preferred embodiment of the present invention, the rules checker program evaluates nodes in an integrated circuit to detect latch nodes. When a latch node is detected, the rules checker program determines whether or not a single pass FET is connected by either its drain or source terminal to the latch node. If so, the rules checker program obtains the pointer to the other drain or source terminal of the pass FET. The rules checker program then obtains a list of elements that are channel-connected to the node designated by the pointer and searches the list to determine whether or not more than one pass FET is contained in the list. If so, the rules checker program determines that the pass FET connected to the latch node is part of a RAM cell structure as opposed to a latch structure.

14 Claims, 6 Drawing Sheets

METHOD AND APPARATUS FOR EVALUATING THE DESIGN QUALITY OF NETWORK NODES

TECHNICAL FIELD OF THE INVENTION

The present invention generally relates to computer-aided circuit design systems and, more particularly, to a method and apparatus for evaluating the design quality of network nodes in an integrated circuit to determine whether a pass field effect transistor (FET) is part of a RAM cell structure.

BACKGROUND OF THE INVENTION

Integrated circuits are electrical circuits comprised of transistors, resistors, capacitors, and other components comprised on a single semiconductor "chip" in which the components are interconnected to perform a given function. Typical examples of integrated circuits include, for example, microprocessors, programmable logic devices (PLDs), electrically erasable programmable memory devices (EEPROMs), random access memory devices (RAMs), operational amplifiers and voltage regulators. A circuit designer typically designs the integrated circuit by using very large scale integrated (VLSI) circuit design techniques to create a circuit schematic which indicates the electrical components and their interconnections. Often, designs are simulated by computer to verify functionality and to ensure that performance goals are satisfied.

In the world of electrical device engineering, the design and analysis work involved in producing electronic devices is often performed using electronic computer aided design (E-CAD) tools. As will be appreciated by those skilled in the art, electronic devices include electrical analog, digital, mixed hardware, optical, electro-mechanical, and a variety of other electrical devices. The design and the subsequent simulation of any circuit board, VLSI chip, or other electrical device via E-CAD tools allows a product to be thoroughly tested and often eliminates the need for building a prototype. Thus, today's sophisticated E-CAD tools may enable the circuit manufacturer to go directly to the manufacturing stage without having to perform costly, time consuming prototyping.

In order to perform the simulation and analysis of a hardware device, E-CAD tools must deal with an electronic representation of the hardware device. A "netlist" is one common representation of a hardware device. As will be appreciated by those skilled in the art of hardware device design, a "netlist" is a detailed circuit specification used by logic synthesizers, circuit simulators and other circuit design optimization tools. A netlist typically comprises a list of circuit components and the interconnections between those components.

The two forms of a netlist are the flat netlist and the hierarchical netlist. Often, a netlist will contain a number of circuit "modules" which are used repetitively throughout the larger circuit. A flat netlist will contain multiple copies of the circuit modules essentially containing no boundary differentiation between the circuit modules and other components in the device. By way of analogy, one graphical representation of a flat netlist is simply the complete schematic of the circuit device.

In contrast, a hierarchical netlist will only maintain one copy of a circuit module which may be used in multiple locations. By way of analogy, one graphical representation of a hierarchical netlist would show the basic and/or non-repetitive devices in schematic form and the more complex and/or repetitive circuit modules would be represented by "black boxes." As will be appreciated by those skilled in the art, a black box is a system or component whose inputs, outputs, and general function are known, but whose contents are not shown. These "black box" representations, hereinafter called "modules", will mask the complexities therein, typically showing only input/output ports.

An integrated circuit design can be represented at different levels of abstraction, such as the Register-Transfer level (RTL) and the logic level, using a hardware description language (HDL). VHDL and Verilog are examples of HDL languages. At any abstraction level, an integrated circuit design is specified using behavioral or structural descriptions, or a mix of both. At the logical level, the behavioral description is specified using boolean equations. The structural description is represented as a netlist of primitive cells. Examples of primitive cells are full-adders, NAND gates, latches, and D-Flip Flops.

Having set forth some very basic information regarding the representation of integrated circuits and other circuit schematics through netlists, systems are presently known that use the information provided in netlists to evaluate circuit timing and other related parameters. More specifically, systems are known that perform a timing analysis of circuits using netlist files. Although the operational specifics may vary from system to system, generally such systems identify certain critical timing paths, and then evaluate the circuit to determine whether timing violations may occur through the critical paths. As is known, timing specifications may be provided to such systems by way of a configuration file.

One such system known in the prior art is marketed under the name PathMill, by EPIC Design Technology, Inc., subsequently purchased by Synopsis, Inc. PathMill is a transistor-based analysis tool used to find critical paths and to verify timing in semiconductor designs. Using static and mixed-level timing analysis, PathMill processes transistors, gates, and timing models. It also calculates timing delays, performs path searches, and checks timing requirements. As is known, PathMill can analyze combinational designs containing gates, and sequential designs containing gates, latches, flip-flops, and clocks. Combinational designs are generally measured through the longest and shortest paths.

While tools such as these are useful for the design verification process after layout, there are various shortcomings in the PathMill product and other similar products. One primary shortcoming of the PathMill program is that it does not analyze the circuits to determine the design quality of the circuits. Rather, PathMill performs a static timing analysis of a circuit using the netlist provided to PathMill. Furthermore, configuring PathMill to recognize various circuit characteristics is typically a very difficult task.

Accordingly, a need exists for a rules checking system that will allow circuits to be evaluated for design quality. The present invention works in conjunction with a tool, such as, for example, PathMill, to build a database which is then utilized by the rules checking system of the present invention to evaluate the design quality of network nodes. Typically, such tools, including PathMill, receive a netlist and use the netlist to determine FET (field effect transistor) direction, node types, latches, dynamic gates, rise and fall times, etc. This information is utilized by the present invention to build a database which is then utilized by the rules checking system of the present invention to evaluate the design quality of network nodes, preferably of network nodes of FET-level circuits designed in accordance with VLSI techniques.

Preferably, the rules checking system of the present invention evaluates circuit nodes to determine whether a pass FET connected to a circuit node is part of a RAM cell structure. In some deep sub-micron integrated circuit processes, it is an improper design to allow latches to be driven by pass FETs which are also NFETs, or in other words, by NFET-only pass FETs. On the other hand, these processes do allow RAM cells to be driven by NFET-only pass FETs. Sometimes errors occur in designing integrated circuits using such processes which result in a latch structure being driven by an NFET-only pass FET. It would be useful to have a system that could detect when this condition has occurred.

Accordingly, a need exists for a rules checking system that will allow a determination to be made as to whether an NFET-only pass FET is part of a RAM cell structure or whether it is part of a latch structure.

SUMMARY OF THE INVENTION

The present invention provides a method and apparatus for evaluating an integrated circuit design to determine whether a pass FET is part of a RAM cell structure in the integrated circuit design. The apparatus comprises a computer capable of being configured to execute a rules checker program which analyzes information relating to the integrated circuit to determine whether a pass FET in the integrated circuit is part of a RAM cell structure. The rules checker program of the present invention evaluates each pass FET which is channel-connected at one of its terminals to a latch node and determines whether that pass FET is channel-connected at one of its other terminals to one or more other pass FET. If so, the pass FET being evaluated is part of a RAM cell structure.

In accordance with the preferred embodiment of the present invention, the rules checker program evaluates nodes in an integrated circuit to detect latch nodes. When a latch node is detected, the rules checker program determines whether or not a single pass FET is channel-connected to the latch node, i.e., whether the drain or source of a single pass FET is connected to the latch node. If so, the rules checker program obtains the pointer to the other drain or source terminal of the pass FET. The rules checker program then obtains a list of elements that are channel-connected to the terminal designated by the pointer. The rules checker program then searches the list and determines whether more than one pass FET is contained in the list. If so, the rules checker program determines that the pass FET connected to the latch node is part of a RAM cell structure as opposed to a latch structure.

Other features and advantages of the present invention will become apparent from the following description, drawings and claims.

DETAILED DESCRIPTION OF THE INVENTION

Figure 1:
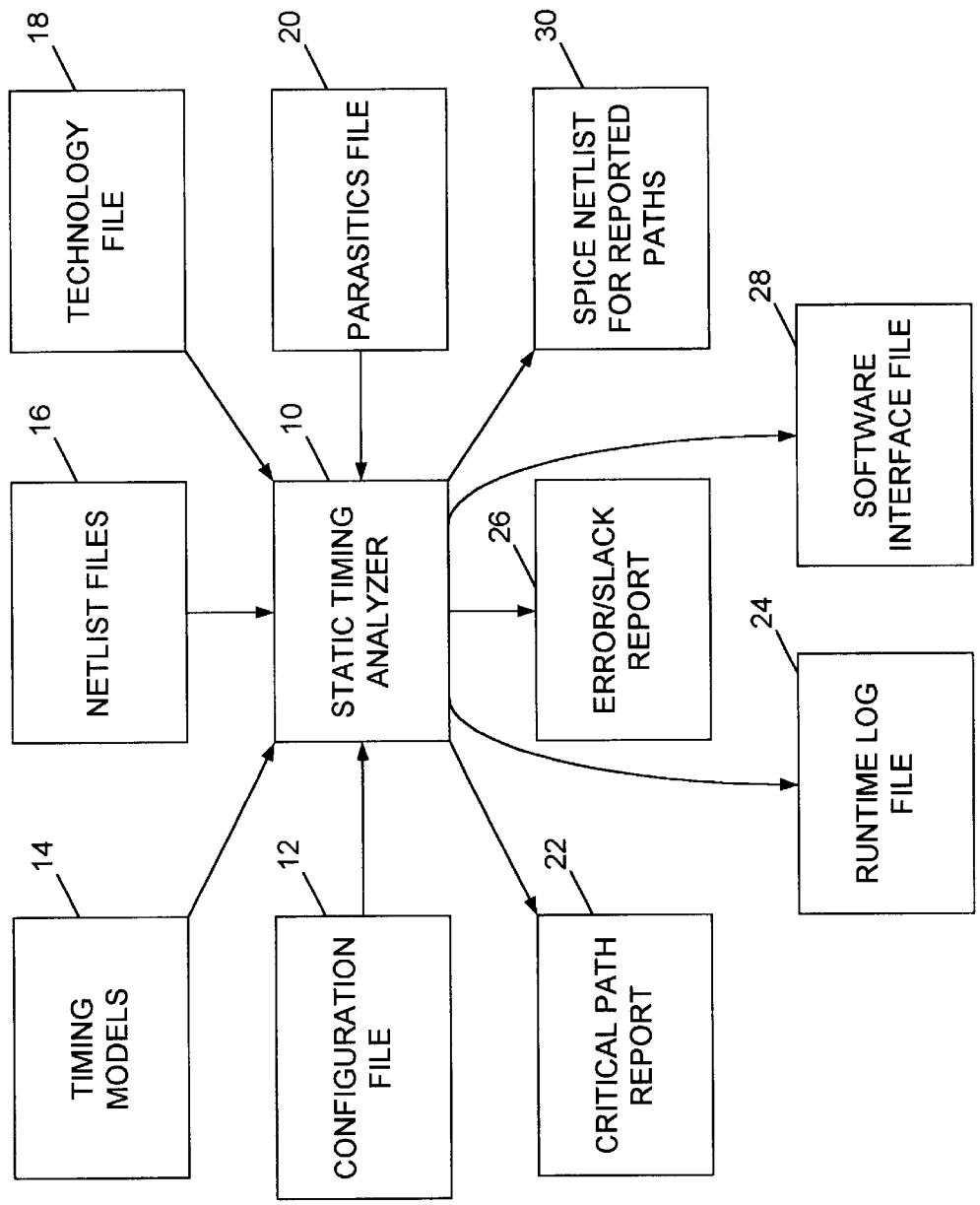
FIG. 1 is a block diagram of a static timing analyzer system, which is known in the prior art.

Having summarized various aspects of the present invention, reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims.

Referring now to the drawings, reference is made to FIG. 1, which is a block diagram of a prior art static timing analyzer program that illustrates the basic informational flow in such a system. Specifically, and as previously mentioned, one such system is marketed under the name PathMill. FIG. 1 is a diagram that illustrates the informational flow in the PathMill system. At the center of the diagram is a block denoted as static timing analyzer 10, which represents the PathMill program. Surrounding this block 10 are a number of other blocks that represent various input and output files and/or information.

More particularly, the PathMill program may utilize a configuration file 12, a file of timing models 14, one or more netlist files 16, a technology file 18, and a parasitic file 20, for various input information. In addition, the PathMill program may generate a number of different output files or other output information, including a critical path report 22, a runtime log file 24, an error report 26, a software interface file 28, and a SPICE netlist 30. When started, the PathMill program first processes the input netlist file(s) 16, the technology file 18, and the configuration files 12. The information from these files is subsequently used for performing path analyses. Since the PathMill program is publicly available and marketed, its function and operation are well known, and therefore need not be discussed in detail herein.

For purposes of illustrating the present invention, much of the diagram and information illustrated in FIG. 1 is not shown in connection with the inventive system. In this regard, reference is made to FIG. 2, which shows one embodiment of a system constructed in accordance with the present invention. In the illustrated embodiment, only the static timing analyzer 10, the configuration file 12 and the netlist file 16 of FIG. 1 are shown. The configuration file(s) 12 contains information that informs the static timing analyzer 10 how to perform its analysis, and various numbers of configuration files may be used. The netlist file 16, as is known, defines the various integrated circuit components, and their inter-relations.

Figure 2:
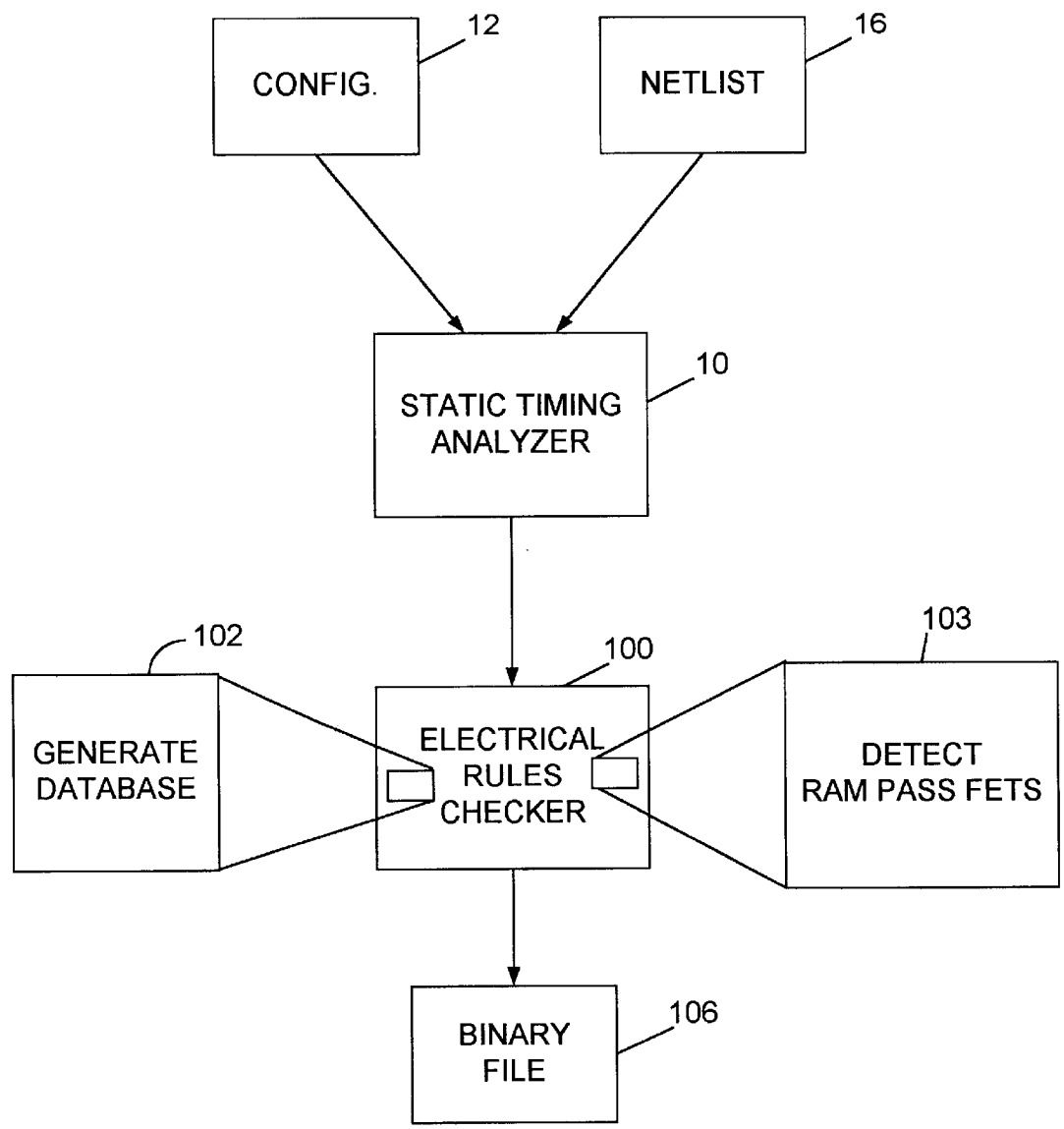
FIG. 2 is a block diagram illustrating the orientation of the electrical rules checker of the present invention in relation to an existing static timing analyzer.

The system shown in FIG. 2 preferably utilizes a computer (not shown) for its operation which runs the static timing analyzer program 10 and the electrical rules checker program 100. The computer may be electrically coupled to a memory device (not shown) which functions as a system storage unit for storing the code and data utilized and/or generated by the system. Those skilled in the art will realize that the present invention is not limited to any particular type of computer or memory device for performing these functions.

It should also be noted that the term "computer", as that term is used herein, is intended to denote any machine capable of performing the calculations, or computations, necessary to perform the tasks of the present invention. In essence, this includes any machine that is capable of accepting a structured input and of processing the input in accordance with prescribed rules to produce an output. Furthermore, those skilled in the art will understand that the system shown in FIG. 2 may be implemented in hardware, software, or a combination of both, and is not limited to any particular physical, structural, or electrical configuration.

The electrical rules checker 100 program of the present invention is preferably configured to operate on an output of the static timing analyzer 10. In this regard, the static timing analyzer may be configured to generate an output netlist database, which the electrical rules checker 100 of the present invention utilizes as an input. As previously mentioned, there are a wide variety of reasons why an electrical rules checking program may be desired. One such reason is to perform various checks over certain rules or strategies in an integrated circuit design. Such rules may vary from circuit to circuit, depending upon the particular application. For example, a portion of the electrical rules checker program 100 in accordance with the preferred embodiment of the present invention operates to identify predischarge nodes in an integrated circuit design. This is only one example of the multitude of checks that may be performed by the electrical rules checker program 100 of the present invention.

As is known, a large scale integrated circuit design is often done at the FET level. A designer may utilize thousands of interconnected FETs in designing a portion of an integrated circuit. Although the designer may make every effort to follow certain design guidelines, mistakes may nevertheless be made. Accordingly, the electrical rules checker 100 of the present invention provides an excellent mechanism for double-checking designs and design layouts. Furthermore, the electrical rules checker 100 of the present invention may generate an output binary file 106, which may ultimately be used in subsequent executions of the electrical rules checker 100.

However, prior to the electrical rules checker 100 of the present invention performing any of the rules checking tasks, a database of nodes and elements of the circuit to be evaluated must be generated. This database is then utilized by the electrical rules checker 100 of the present invention to perform the rules checking tasks. However, it should be noted that the database and the method in which it is generated is not limited to use with any particular rules checker. They may be used with virtually any type of rules checker which evaluates nodes for design quality. For example, the database of the present invention may also be used with rules checkers which evaluate nodes for mechanical and chemical systems. It will be apparent to those skilled in the art how data structures similar to those generated for elements and nodes in the electrical context may be generated in mechanical and chemical contexts and used for rules checking in those contexts.

The manner in which this database is generated will now be discussed below with respect to FIGS. 3A–3C. For purposes of illustration, it will be assumed that the static timing analyzer 10, shown in FIG. 2 and discussed above, is the Pathmill static timing analyzer, in order to provide an example of one possible implementation of the present invention. However, those skilled in the art will understand that the electrical rules checker 100 of the present invention and the database of the present invention are not limited to use with any particular program.

The Pathmill static timing analyzer provides an application program interface (API) which allows the Pathmill static timing analyzer to communicate with the electrical rules checker 100 of the present invention. This API allows code external to the Pathmill program to be linked to the Pathmill program so that the external code and the Pathmill program itself comprise one executable which can be run as a single program. The electrical rules checker 100 of the present invention utilizes this API to obtain information from the Pathmill static timing analyzer which can be utilized by the electrical rules checker 100 to generate the database of the present invention, as indicated by block 102. This database is then utilized by the rules checker program 100 to perform the task 103 of determining whether a pass FET is part of a RAM cell structure in the integrated circuit design.

Prior to the database of the present invention being generated, the Pathmill program runs and identifies circuit characteristics of the circuit under consideration such as, for example, FET direction, node types, latches, dynamic gates, clocks, rise and fall times, etc. Before the Pathmill program terminates, it calls the electrical rules checker 100 of the present invention. The Pathmill program has a feature commonly referred to as "hooks", which allows the Pathmill program to call routines at various stages of execution. Once the Pathmill program has finished identifying the characteristics mentioned above, the Pathmill program calls the electrical rules checker 100 of the present invention. The electrical rules checker 100 of the present invention, through this series of subroutine calls, creates its own database of the circuit under consideration.

Figure 3A:
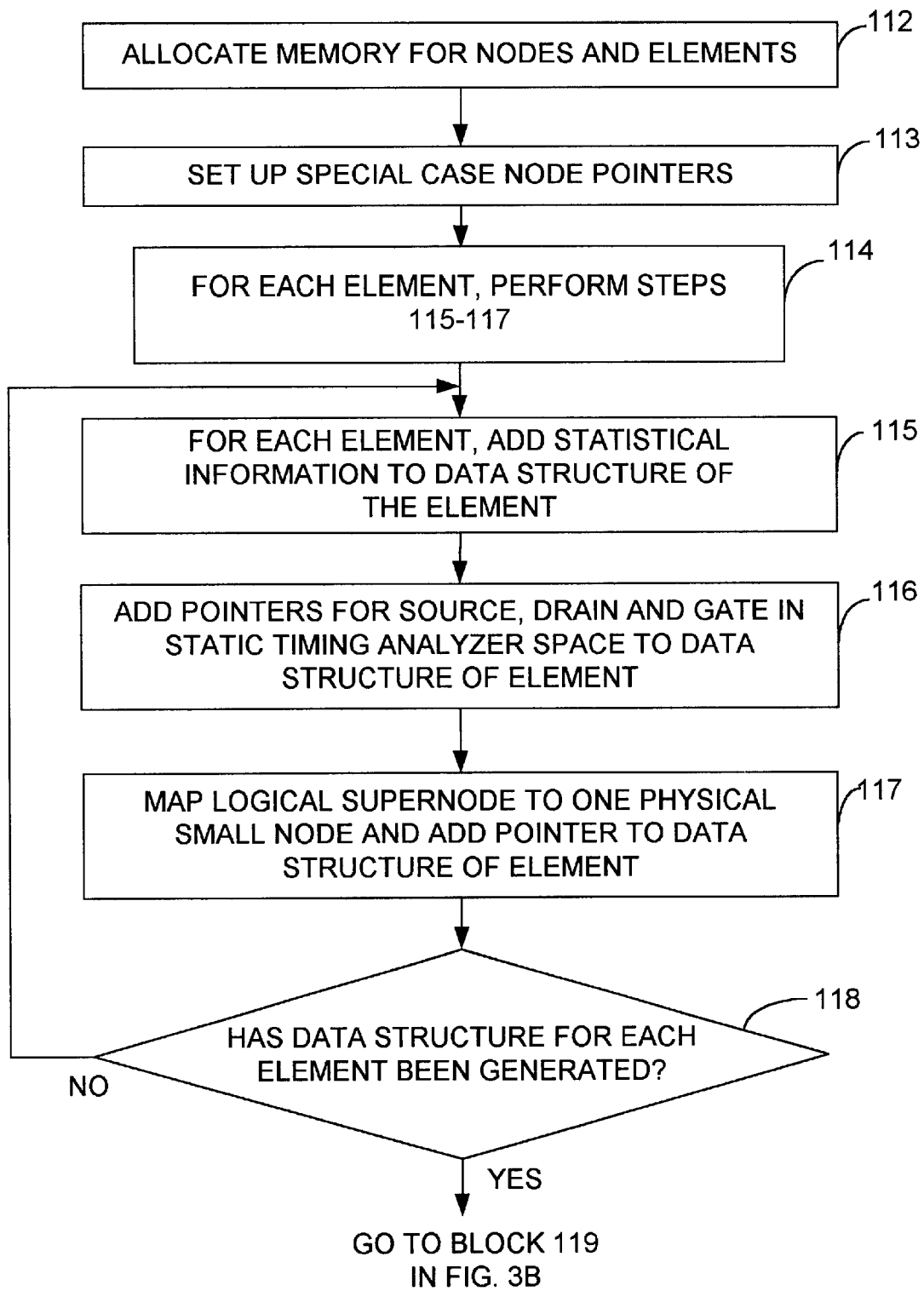
FIGS. 3A–3C together form a flow chart which illustrates the method of the present invention for generating the database of the present invention which can be utilized by the electrical rules checker of the present invention shown in FIG. 2 to perform rules checking tasks.
Figure 3B:
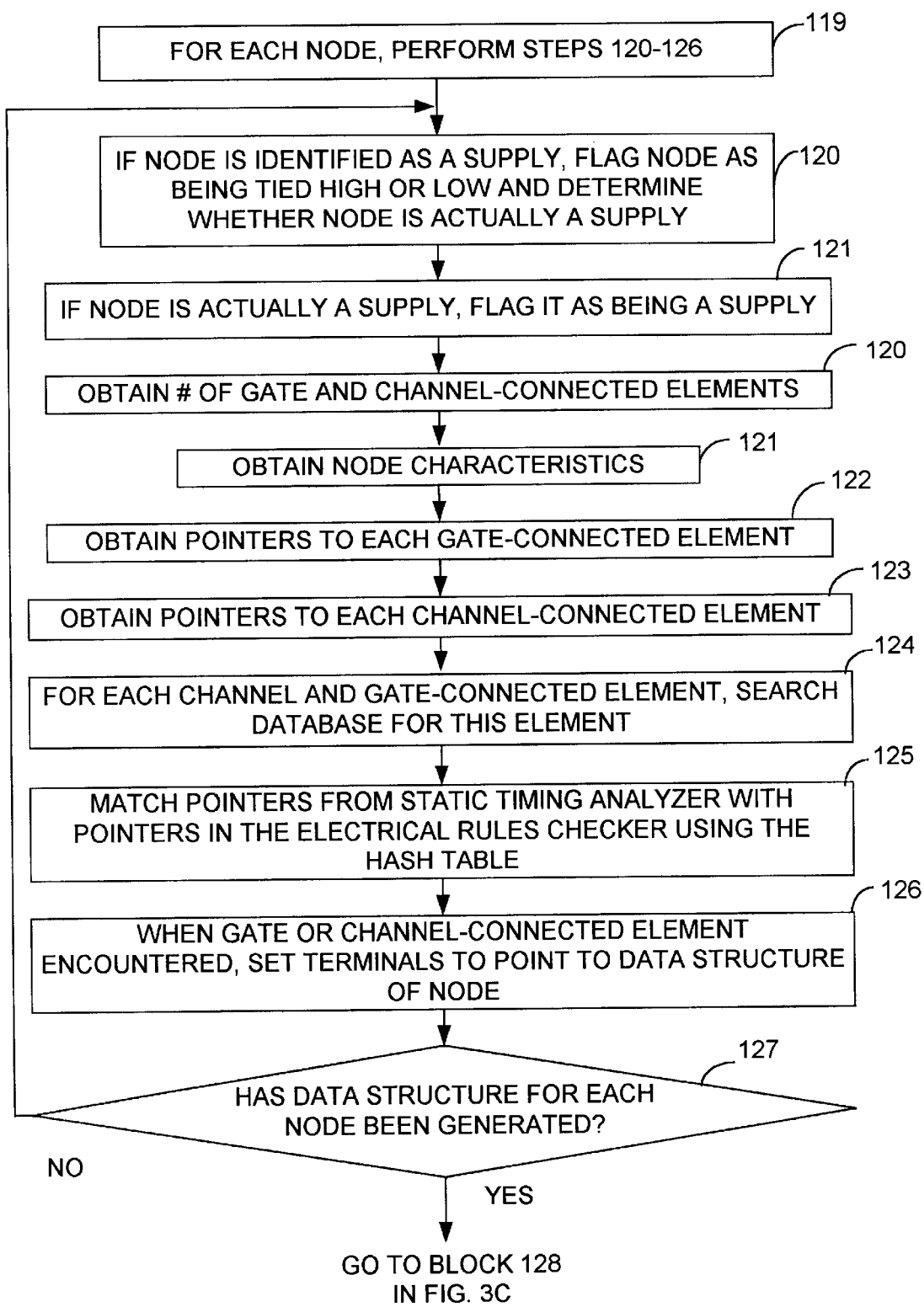

The first step in the process of generating the database is to allocate memory for the nodes and elements of the circuit, as indicated by block 112 in FIG. 3A. The Pathmill program provides information via its API about the number of elements and nodes in the circuit of the electrical rules checker 100 and this information is utilized by the electrical rules checker 100 to perform memory allocation. Certain types of nodes and elements do not require as much information about their characteristics as do other types of nodes and elements. Therefore, the amount of memory allocated may vary for different types of nodes and elements. Rather than merely basing memory allocation on the number of nodes and elements in the circuit, it may be desirable to distinguish between different types of nodes and elements so that memory can be more efficiently allocated.

However, it will be apparent to those skilled in the art that the present invention is not limited with respect to the manner in which memory space is allocated for the nodes and elements. Those skilled in the art will understand the manner in which the memory allocation task, and any optimizations of it, can be performed. Therefore, in the interest of brevity, a detailed discussion of the memory allocation task for the nodes and elements will not be provided herein.

Once memory has been allocated for the nodes and elements, the next step in the process of the present invention is to set up node pointers for special cases of nodes, as indicated by block 114. These special types of nodes will be used repeatedly during the process of generating the database, as discussed below in more detail. Therefore, the pointers for these nodes preferably are set up relatively early in the database generation process. For example, nodes which correspond to ground (GND) and to the supply voltage ($V_{DD}$) are special types of nodes and it is helpful to set up node pointers for these types of nodes. However, those skilled in the art will understand that this step, although it is preferable, is not necessary, but rather, is used to optimize efficiency in the database generation process of the present invention.

For each element, a data structure must be generated which can be utilized by the electrical rules checker 100 in performing the rules checking tasks. Steps 115–117 in FIG. 3A correspond to the steps for creating the element data structures. For each element, a data structure is defined and statistical information relating to the element is added to the data structure of the element, as indicated by block 115. This information includes, for example, the width of the element, the length of the element, the direction of the element, and the element type.

Once the statistical information has been included in the data structure of the element, the pointers for the source, drain and gate of each element, as defined in the space of the static timing analyzer, are included in the data structure of the element, as indicated by block 116. The pointers that were set up in step 114 are utilized in step 116. If either the source, drain or gate of the element is attached to ground or VDD, then the pointers for the source, drain and gate are set to the pointers for ground or VDD obtained in step 114.

A node in a circuit can be represented logically or physically. A logical representation of an element includes only FETs and does not include any resistors. This logical representation is identified in the Pathmill program as a "supernode". The logical representation does not account for parasitic resistance. On the other hand, a physical representation of a node, which is identified in the Pathmill program as a small node, includes FETs, but also includes resistors, which correspond to the parasitic resistance in the node. Therefore, in the physical representation, a small node exists between the resistors representing the parasitic resistance and between any FET and any one of the resistors. Each element has a pointer to a supernode and to a small node for each drain, source and gate. Therefore, there are six pointers for each FET.

All of the small nodes in the physical representation map to the same supernode in the logical representation. In Pathmill, the supernode of the logical representation is mapped to one of the physical small nodes, and vice versa. In block 117, the pointers corresponding to these nodes are added to the data structure of the element.

Once the data structures for the elements have been generated, the data structures for the nodes must be generated. Blocks 118–120 in FIG. 3A and blocks 121–126 in FIG. 3B correspond to the steps in the process of the present invention for generating the data structures of the nodes. In block 118, a determination is made as to whether a node has been identified by the Pathmill program as a supply. The Pathmill program identifies all nodes as supplies if the nodes are either tied high or low. If the node has been identified by the Pathmill program as corresponding to a supply, the node is flagged and the flag will indicate whether the node is tied high or whether it is tied low. A determination is then made as to whether the node is actually a supply, i.e., whether the node actually corresponds to ground or $V_{DD}$. If a determination is made that the node is actually a supply, the node is flagged as corresponding to a supply, as indicated by block 119.

The electrical rules checker 100 then obtains the number of gate-connected elements and the number of channel-connected elements from the static timing analyzer, as indicated by block 120. The electrical rules checker 100 also obtains the characteristics of the nodes from the static timing analyzer 10, as indicated by block 121. These characteristics include, for example, capacitance, node type, rise and fall time, etc. Once the characteristics of the node have been obtained, the electrical rules checker 100 obtains the pointers provided by the static timing analyzer 10 that point to each gate-connected element, as indicated by block 122. The electrical rules checker 100 then obtains the pointers from the static timing analyzer which point to each channel-connected element, as indicated by block 123. Then, for each channel-connected element and for each gate-connected element, the electrical rules checker 100 searches its database to find an element in the space of the electrical rules checker 100 that corresponds to the element under consideration, as indicated by block 124.

The pointers for the elements provided by the static timing analyzer 10 are then matched with the pointers for the corresponding elements in the electrical rules checker 100 using a hash table which converts the pointers in the space of the static timing analyzer 10 into pointers in the space of the electrical rules checker 100, as indicated by block 125. Generally, each of the pointers in the space of the static timing analyzer corresponds to a hash key and when the hash key is plugged into the hash table, the pointer in the space of the electrical rules checker is output from the hash table. Hash tables and the manner in which they are utilized are well-known in the art. Therefore, a detailed discussion of the manner in which the pointers in the space of the static timing analyzer are converted using the hash table into pointers in the space of the electrical rules checker 100 will not be provided herein since persons skilled in the art will understand the manner in which this can be accomplished.

Once these steps have been performed, the electrical rules checker 100 has at its disposal a list of channel-connected elements and gate-connected elements as well as their pointers in the space of the electrical rules checker 100. In generating the node data structures, when the electrical rules checker 100 encounters a node that is connected to one of these channel-connected or gate-connected elements, the electrical rules checker 100 sets the terminals of the element to point to the data structure of the node under consideration, as indicated by block 126. The process then returns to the step in block 120 and generation of the data structure for the next node begins, as indicated by decisional block 127.

Figure 3C:
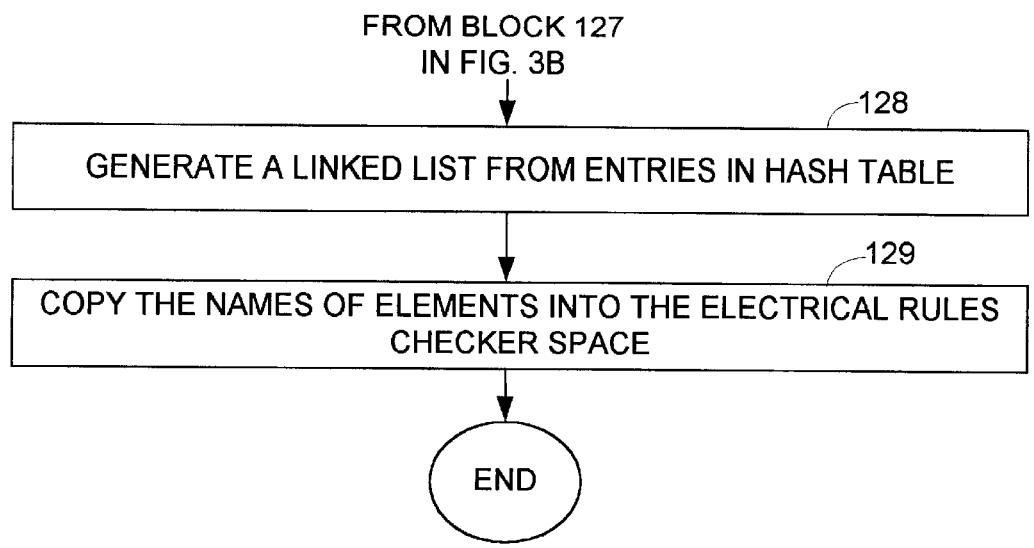

In order to enable the electrical rules checker 100 to maximize efficiency in searching the database of the present invention, once the data structures for all of the nodes have been created, a linked list is generated from the entries in the hash table, as indicated by block 128 in FIG. 3C. Every location in the hash table will not contain a valid entry. Therefore, in order to maximize efficiency in searching the database, a linked list is generated which links the valid entries in the hash table together such that each valid entry in the hash table points to the next valid entry in the hash table, as indicated by block 128. Thus, when the electrical rules checker 100 of the present invention is searching for an element in the database of the present invention, the electrical rules checker 100 simply analyzes the elements contained in the linked list.

It should be noted that the arrangement of the elements in the linked list may or may not have any physical relationship to the arrangement of the elements in the circuit under consideration. Thus, the linked list is merely used to search through the elements stored in the database. Once the linked list has been generated, the names of the elements contained in the linked list are copied into electrical rules checker space, as indicated by block 129. This reduces the number of calls that need to be made to the Pathmill program by the electrical rules checker 100. Once the database of the present invention has been generated, no more calls have to be made to the Pathmill program via the Pathmill. The database of the present invention is comprised as the binary file 106 shown in FIG. 2.

Once the database of the present invention has been generated in the manner described above, the electrical rules checker 100 of the present invention utilizes this database to perform the rules checking tasks. In accordance with the present invention, the electrical rules checker 100 evaluates a circuit to determine whether or not a pass FET which is connected to a latch node in the circuit is part of a RAM cell structure. This task is represented by block 103 in FIG. 2. The Pathmill program does not distinguish between latch structures and RAM cell structures in an integrated circuit. However, since latches are implemented for different reasons than RAM cells, it is desirable to distinguish between them. The Pathmill program identifies nodes that are connected to cross-coupled inverters as latch nodes, but does not always correctly distinguish between latches and RAM cell structures.

Figure 4A:
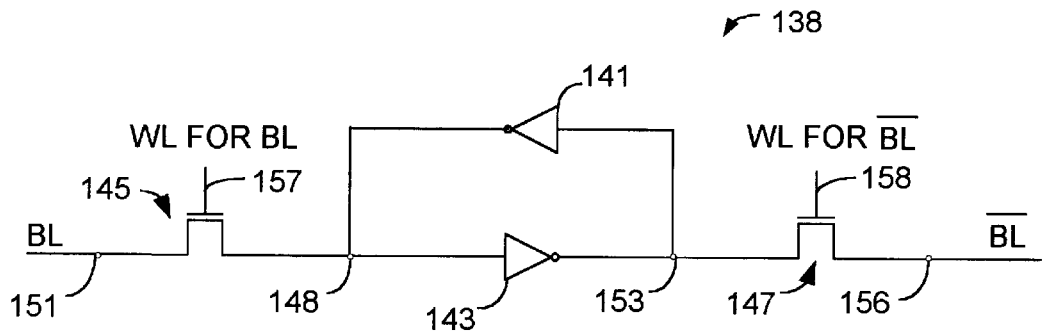
FIG. 4A is a schematic block diagram of cross-coupled inverters which form a latch structure to be evaluated by the electrical rules checker of the present invention shown in FIG. 2.

FIG. 4A is a schematic block diagram of a structure 138 which may be either a RAM cell structure or a latch depending on the manner in which it is being implemented in the integrated circuit design. Latches and RAM cells both comprise cross-coupled inverters 141 and 143 which form a storage cell and which are controller by NFETs 145 and 147 coupled to nodes 148 and 153, respectively, of the storage cell. The FETs 145 and 147 are commonly referred to as pass FETs because they pass logic from one stage to another in the integrated circuit. Normally, the pass FETs are NFETs rather than PFETs due to the faster switching speed and strength of NFETs in comparison to that of PFETs.

The word lines (WL) 157 and 158 are connected to the gate terminals of the NFETs 145 and 147, respectively, and control the writing and reading of data to and from the storage cell. The bit lines BL and BL-complement, the latter of which is designated in FIG. 4A by the bar over BL, are logical complements of one another. The data to be written to or read from the storage cell exists on these bit lines. These bit lines are connected to the NFETs 145 and 147 at nodes 151 and 156, respectively. For exemplary purposes, only one pass FET 145 is shown as being channel-connected by its drain or source terminal to the node 151.

In accordance with the present invention, the electrical rules checker 100 first determines whether a single pass FET is connected to the latch node 148. The electrical rules checker 100 then determines that, if no more than one pass FET is connected to node 151, the structure 138 is a latch as opposed to a RAM cell. On the other hand, if more than one pass FET is connected to node 151, the electrical rules checker 100 determines that the structure 138 is a RAM cell. The manner in which the electrical rules checker 100 of the present invention makes these determinations will be discussed below with reference to FIG. 5.

Figure 4B:
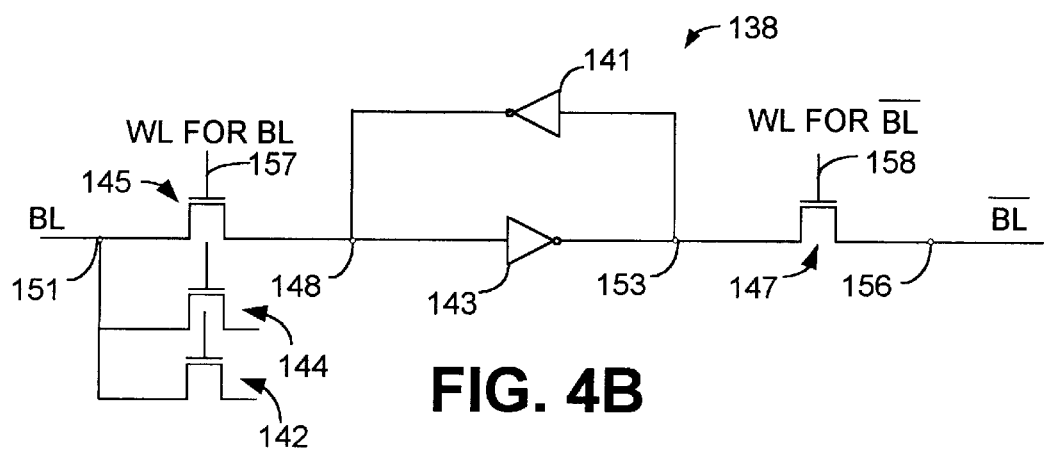
FIG. 4B is a schematic block diagram of cross-coupled inverters which form a RAM cell structure to be evaluated by the electrical rules checker of the present invention shown in FIG. 2.

FIG. 4B illustrates a schematic block diagram of the structure 138 of FIG. 4A which is identical in every respect except that multiple pass FETs are connected to node 151. As shown in FIG. 4B, three pass FETs 142, 144 and 145 are connected to node 151. Therefore, since more than one pass FET is channel-connected to node 151, the electrical rules checker 100 of the present invention will determine that the structure 138 is a RAM cell structure and thus that the pass FET 145 is part of a RAM cell structure.

Figure 5:
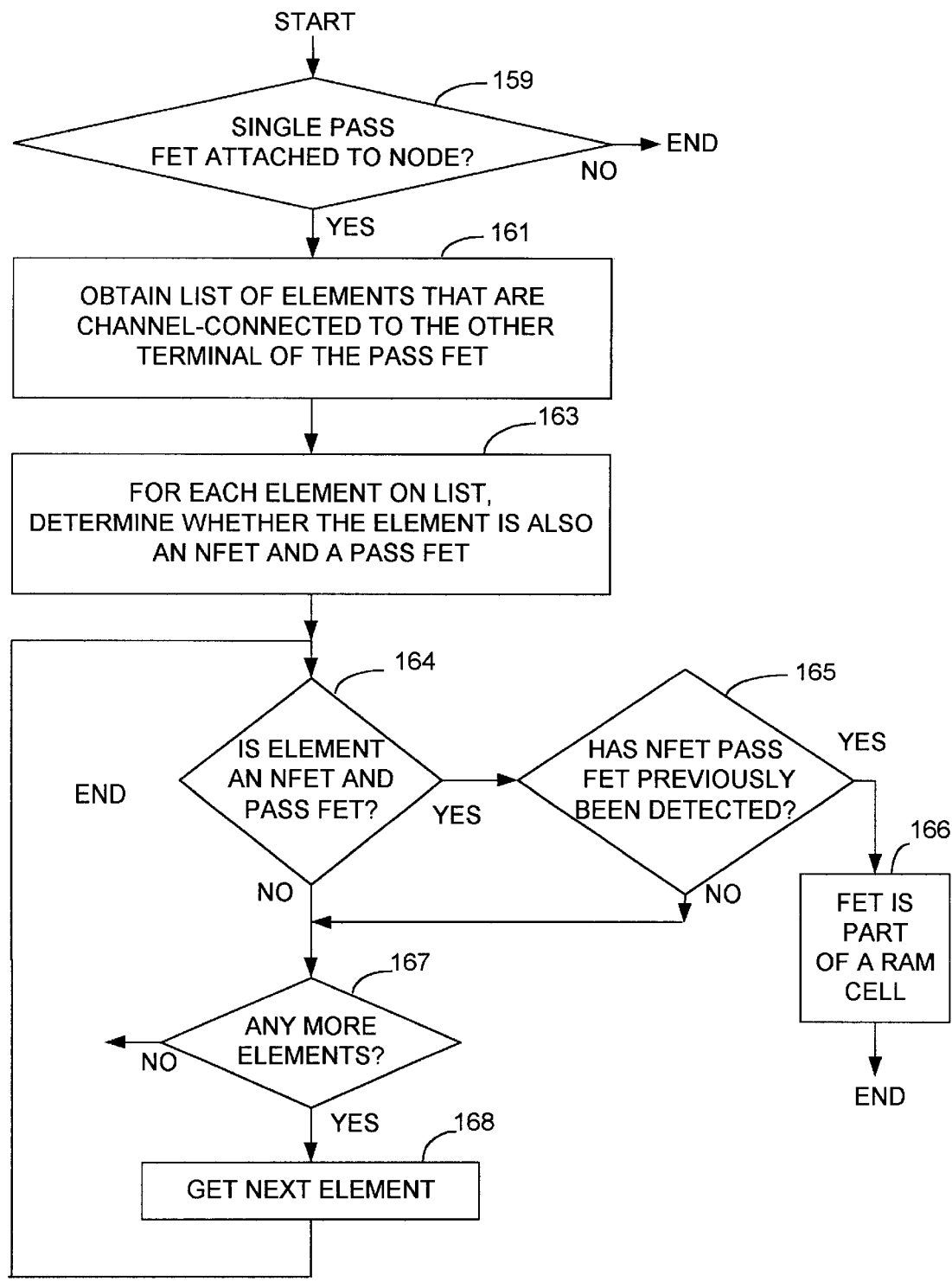
FIG. 5 is a flow chart illustrating the method of the present invention in accordance with the preferred embodiment utilized by the rules checker program shown in FIG. 2 for distinguishing between the structures shown in FIGS. 4A and 4B.

FIG. 5 is a flow chart which illustrates the method of the present invention utilized by the electrical rules checker for determining whether or not the pass FET 145 is part of a RAM cell structure. As discussed above, the node data structures generated by the electrical rules checker 100 during the generation of the database contain information relating to the node type. When the electrical rules checker 100 of the present invention encounters a latch node, the data structure of the node indicates that the node is a latch node. In FIGS. 4A and 4B, nodes 148 and 153 are latch nodes. The electrical rules checker 100 first determines whether a single pass FET is channel-connected to the latch node 148, as indicated by block 159. If not, the electrical rules checker ends the task because it knows it is not looking at a RAM cell structure. If the electrical rules checker 100 determines that a single pass FET is channel-connected to node 148, the process proceeds to block 161. The electrical rules checker 100 then utilizes the database of the present invention to obtain a list of elements that are channel-connected to node 151, as indicated by block 161. Once the list of channel-connected elements has been obtained by the electrical rules checker 100, the electrical rules checker 100 determines whether each element is an NFET-only pass FET, as indicated by blocks 163 and 164. Whenever an NFET-only pass FET is encountered in the list, the electrical rules checker 100 determines whether an NFET-only pass FET has already been encountered in the list, as indicated by block 165. If so, the electrical rules checker determines that the pass FET under consideration (e.g., FET 145 in FIG. 4A) is part of a RAM cell structure and the task is complete.

If a determination is made at block 164 that the element in the list is not an NFET-only pass FET, the process continues to block 167 where a determination is made as to whether the list contains any more elements to be checked. If a determination is made at block 165 that an NFET-only pass FET has not previously been detected, the process also continues to block 167. If there are no more elements to be checked, the task is complete. If the list contains more elements to be checked, the task continues to block 168 and the next element in the list is obtained. The process then returns to decisional block 164.

If a determination s made at block 165 that an NFET-only pass FET has previously been encountered in the list, then the rules checker 100 determines that more than one NFET-only pass FET is channel-connected to node 151. Therefore, the rules checker 100 determines that the single NFET-only pass FET connected to the latch node is part of a RAM cell structure as opposed to a latch.

It should be noted that the foregoing description is not intended to be exhaustive or to limit the invention to the precise forms disclosed. Those skilled in the art will understand that modifications or variations are possible in light of the above teachings, which are within the scope of the present invention. In this regard, the embodiment discussed above was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention.

What is claimed is:

1. An apparatus for determining whether a first pass field effect transistor connected to a node in an integrated circuit is part of a RAM cell structure, the apparatus comprising:

a computer capable of being configured to execute a rules checker program, the rules checker program analyzing information relating to the integrated circuit to determine whether or not more than one pass field effect transistor is connected to the first pass field effect transistor, wherein if the rules checker program determines that at least one other pass field effect transistor is connected to the first pass field effect transistor, the rules checker program determines that the first pass field effect transistor is part of a RAM cell structure.

2. The apparatus of claim 1, wherein the node is a latch node, and wherein the rules checker program evaluates each node in the integrated circuit to determine whether or not each node is a latch node by analyzing the information relating to the integrated circuit to determine whether or not the node being evaluated is a latch node, wherein when the rules checker program determines that a node is a latch node, the rules checker program determines whether the first pass filed effect transistor is the only pass field effect transistor that is channel-connected to the latch node, wherein if a determination is made that the first pass field effect transistor is channel-connected to the latch node, the rules checker program then evaluates a list of elements that are channel-connected to a node opposite the latch node to determine whether the list contains more than one element that is a pass field effect transistor, the node opposite the latch node being connected to a drain or source terminal of the first pass field effect transistor, wherein if the rules checker program determines that the list contains more than one pass field effect transistor, the rules checker program determines that the first pass field effect transistor is part of a RAM cell structure.

3. The apparatus of claim 2, wherein if the rules checker program determines that the list contains less than one pass field effect transistor, the rules checker program determines that the first pass field effect transistor is part of a latch structure.

4. The apparatus of claim 2, wherein the first pass field effect transistor is an N field effect transistor and wherein the rules checker determines that the first pass field effect transistor is part of a RAM cell structure when the rules checker program determines that the list contains more than one pass field effect transistor that is an N field effect transistor.

5. A computer program embodied on a computer-readable medium, the computer program evaluating a first pass field effect transistor of a circuit design to determine whether the first pass field effect transistor is part of a RAM cell structure or whether the first pass field effect transistor is part of a latch structure, the program comprising:

a first code segment for detecting a latch node in the circuit design;

a second code segment for detecting a first pass field effect transistor connected to the latch node;

a third code segment for determining whether or not at least a second pass field effect transistor is connected to the first pass field effect transistor, wherein if the third code segment determines that at least the secondpass field effect transistor is connected to the first pass field effect transistor, the third code segment determines that the first pass field effect transistor is part of a RAM cell structure.

6. The computer program of claim 5, wherein the third code segment evaluates a list of elements that are channel-connected to a second node to which the first pass field effect transistor is channel-connected to determine whether more than one pass field effect transistor is connected to the first pass field effect transistor, the first pass field effect transistor being connected by a drain or source terminal to the latch node and to the second node, wherein if the third code segment determines that the list contains more than one pass field effect transistor including the first pass field effect transistor, the third code segment determines that the first pass field effect transistor is part of a RAM cell structure.

7. A computer program embodied on a computer-readable medium, the computer program evaluating a first pass field effect transistor of a circuit design to determine whether the first pass field effect transistor is part of a RAM cell structure or whether the first pass field effect transistor is part of a latch structure, the program comprising:

a first code segment for detecting a latch node in the circuit design;

a second code segment for detecting a first pass field effect transistor connected to the latch node;

a third code segment for determining whether no other pass field effect transistors are connected to the first pass field effect transistor, wherein if the third code segment determines that no other pass field effect transistors are connected to the first pass field effect transistor, the third code segment determines that the first pass field effect transistor is part of a latch structure.

8. A method for determining whether a first pass field effect transistor connected by a drain or source terminal of the transistor to a latch node in an integrated circuit is part of a RAM cell structure, the method comprising the steps of:

analyzing information relating to the integrated circuit to determine whether or not at least a second pass field effect transistor is connected to a second node of the integrated circuit by a drain or source terminal of the second pass field effect transistor, the first pass field effect transistor being connected to the second node by a drain or source terminal of the second pass field effect transistor, wherein if a determination is made that at least a second pass field effect transistor is connected to the second node, a determination is made that the first pass field effect transistor is part of a RAM cell structure.

9. The method of claim 8, wherein the analyzing step further comprises the steps of:

evaluating each node in the integrated circuit to determine whether or not the node being evaluated is a latch node;

if a determination is made that a node is a latch node, determining whether the first pass field effect transistor is the only pass field effect transistor connected by a drain or source terminal to the latch node; and if a determination is made that the first pass field effect transistor is the only pass field effect transistor connected by a drain or source terminal to the latch node, evaluating a list of elements that are channel-connected to the second node to determine whether the list contains more than one element that is a pass field effect transistor, wherein if a determination is made that the list contains more than one pass field effect transistor including the first pass filed effect transistor, a determination is made that the first pass field effect transistor is part of a RAM cell structure.

10. The method of claim 9, wherein the first pass field effect transistor is an N field effect transistor and wherein the list is evaluated to determine whether the list contains more than one pass field effect transistor that is an N filed effect transistor including the first pass field effect transistor, wherein if a determination is made that the list contains more than one pass field effect transistor that is an N field effect transistor including the first pass field effect transistor, a determination is made that the first pass field effect transistor is part of a RAM cell structure.

11. An apparatus for determining whether a first pass field effect transistor connected to a node in an integrated circuit is part of a RAM cell structure or is part of a latch structure, the apparatus comprising:

means for analyzing information relating to the integrated circuit to determine whether or not at least one other pass field effect transistor is connected to the first pass field effect transistor, wherein if said means determines that at least one other pass field effect transistor is connected to the first pass field effect transistor, the rules checker program determines that the first pass field effect transistor is part of a RAM cell structure.

12. The apparatus of claim 11, wherein the node is a latch node, and wherein said means evaluates each node in the integrated circuit to determine whether or not each node is a latch node by analyzing the information relating to the integrated circuit to determine whether or not the node being evaluated is a latch node, wherein when said means determines that a node is a latch node, said means determines whether or not the first pass field effect transistor is the only pass field effect transistor that is channel-connected to the first latch node, wherein if said means determines that the first pass field effect transistor is the only pass field effect transistor that is channel-connected to the first latch node, said means evaluates a list of elements that are channel-connected to the latch node and determines whether the list contains more than one element that is a pass field effect transistor, wherein if said means determines that the list contains more than one pass field effect transistor, said means determines that the first pass field effect transistor is part of a RAM cell structure.

13. The apparatus of claim 11, wherein if said means evaluates the list and determines that the list does not contain more than one first pass field effect transistor, said means determines that the first pass field effect transistor is part of a latch structure.

14. The apparatus of claim 12, wherein the first pass field effect transistor is an N field effect transistor and wherein said means determines that the first pass field effect transistor is part of a RAM cell structure when said means determines that the list contains more than one pass field effect transistor that is an N field effect transistor.

* * * * *